United States Patent [19]

Chen et al.

[11] Patent Number: 5,208,215
[45] Date of Patent: May 4, 1993

[54] PROCESS FOR FABRICATING FLEXIBLE BI-PB-SR-CA-CU-O SUPERCONDUCTING TAPE

[75] Inventors: Kouth Chen, Taipei Shen; Lian-Haei Horng, Tao-Yen; Horng-Show Koo, Hsinchu; Weir-Mirn Hurng, Ping-tung; Wun-Hsin Lee, Hsinchu, all of Taiwan

[73] Assignee: Industrial Technology Research Institute, Taiwan

[21] Appl. No.: 747,976

[22] Filed: Aug. 21, 1991

[51] Int. Cl.$^5$ .............................. H01C 39/14
[52] U.S. Cl. ................................ 505/1; 148/96; 505/737; 505/740; 505/742
[58] Field of Search ............... 505/1, 734–742; 148/11.5 R, 11.5 P, 96

[56] References Cited

U.S. PATENT DOCUMENTS

| | | | |
|---|---|---|---|
| 4,952,554 | 8/1990 | Jin et al. | 505/740 |
| 4,975,416 | 12/1990 | Onishi et al. | 505/1 |
| 5,045,527 | 9/1991 | Ikeno et al. | 505/740 |
| 5,100,865 | 3/1992 | Yamamoto et al. | 505/1 |
| 5,102,863 | 4/1992 | Cass et al. | 505/736 |

OTHER PUBLICATIONS

A technical paper entitled: "High–Jc Silver-Sheathed Bi–Based Superconducting Wires" published in Ieee Transactions on Magnetics, vol. 27, No. 2, Mar. 1991, pp. 231–238.

*Primary Examiner*—George Wyszomierski
*Attorney, Agent, or Firm*—Marks & Murase

[57] ABSTRACT

A superconducting tape is fabricated with a composition of $Bi_{1.81}Pb_{0.43}Sr_{1.71}Ca_{2.14}Cu_3O_x$. The powder of composition is filled into a silver tube and the silver tube is processed by rolling or pressing into a thin tape. The thin tape is heat treated and pressed for several times until the superconducting phase is formed to the tape and the thickness of the tape is equal to or less than 0.07 mm. The resulting tape is highly flexible such that it can be bent into an arc with a very small radius of curvature and nonetheless provide high critical current density.

2 Claims, 7 Drawing Sheets

PROCESS FOR FABRICATING FLEXIBLE BI-PB-SR-CA-CU-O SUPERCONDUCTING TAPE

BACKGROUND OF THE INVENTION

1. Field of the Invention

The present invention relates to a process for fabricating superconducting tape, and more particularly, the fabricated superconducting tape is highly flexible and nonetheless retains high critical current density when it is curved with a small radius of curvature at the temperature of liquid nitrogen (77° K.).

2. Description of Prior Art

To put superconducting material into practical or commercial use, not only the superconducting properties thereof should be considered, i.e. the critical temperature $T_c$, the critical magnetic field $H_c$, and the critical current density $J_c$, but also the mechanical properties thereof such as the flexibility, the strength, the hardness, and the ductility etc. Among these mechanical properties, ductility and flexibility are generally considered the most important factors in determining the utility values of a superconducting material since electric conductors are often elongated and wound into coils for producing magnetic field. If a superconducting material is brittle, it is difficult to be made into electrical conducting wires and consequently has few utility values.

Accordingly, it is usually an important object for superconductor researchers to discover superconducting materials which not only provides superconducting properties at a certain temperature but also provides flexibility so as to be capable of being wound into a coil with a small diameter.

For practical applications, the critical current density $J_c$ of a superconducting wire should be as large as $10^4$ A/cm$^2$ in order to produce usable high magnetic field. The superconducting wire is generally wound into coils for this purpose. However, in view of a known principle that a superconducting wire provides the largest critical current density $J_c$ when it is a straight line and as the superconducting wire is bent, the critical current density $J_c$ therein will be degenerated. The larger the curvature of the wire becomes, the more the critical current density $J_c$ degenerates. Accordingly, as the superconducting wire is wound into a coil with a smaller diameter, the magnetic field produced thereby will also be degenerated.

In a U.S. Pat. No. 4,975,416, Onishi et al teach a method of producing superconducting ceramic wire. The patent discloses two chemical compositions produced by the method; the first composition is of the following form:

Bi$_2$Sr$_2$Ca$_2$Cu$_3$O$_x$, and which is produced by using a mixture selected from the group consisting of Bi$_2$O$_3$, SrO$_3$, CaCO$_3$, and CuO and is referred to as System A; and the second composition is of the following form:

Bi$_{1.6}$Pb$_{0.4}$Sr$_2$Ca$_2$Cu$_3$O$_x$ and which is produced by using a mixture selected from the group consisting of Bi$_2$O$_3$, PbO, SrO$_3$, CaCO$_3$, and CuO and is referred to as System B.

A superconducting wire made of either System A or System B is capable of being bent into the shape of an arc with a radius of curvature down to about 0.5 cm but the critical current density $J_c$ thereof is only 250 A/cm$^2$. The superconducting wire made of System B has a critical temperature $T_c(R=0)$ 101° K. (where $R=0$ herein and hereinafter represents zero resistance), and a critical current density $J_c=100$ A/cm$^2$ at 77° K. in zero magnetic field. Furthermore, if Ag$_2$O is added to the composition of System B in an amount of 20% by weight thereof, two wires with superior flexibility can be produced, one with:

$T_c(R=0)=87°$ K., $J_c=250$ A/cm$^2$ (70° K., zero magnetic field), and the other with:

$T_c(R=0)=102°$ K., $J_c=250$ A/cm$^2$ (77° K., zero magnetic field).

The Onishi et al patent has successfully disclosed a highly flexible superconducting wire. However, the critical current density $J_c$ is still not a satisfactory one when the wire is curved into a coil with a small radius of curvature.

SUMMARY OF THE INVENTION

The present invention provides a process for fabricating superconducting tape, the flexibility thereof is as good as the prior art. However, the superconducting tape fabricated by the process according to the present invention is capable of producing much higher critical current density $J_c$ than the prior art when both are curved with a same radius of curvature.

The process according to the present invention for fabricating a superconducting tape comprises the steps of: (a) preparing a precursor of Bi-based superconducting composition; (b) filling the precursor in a silver tube; (c) refashioning the silver tube into a tape; (d) performing heat treatment to the tape to form a superconducting phase therefor; (e) pressing the tape until the thickness thereof is equal to or less than 0.07 mm; and (f) performing heat treatment to the tape.

For better forming the superconducting phase for the tape, the tape generally is not pressed at the first time to the desired thickness below 0.07 mm. Instead, the Steps (e) to said Step (f) are usually repeated at least once.

It is the most important aspect of the present invention that the thickness of the tape be pressed to be equal to or less than 0.07 mm. Otherwise, the tape would not exhibit the superior superconducting properties to the prior art. The tape fabricated utilizing the process according to the present invention has the superconducting properties of:

(1) $T_c(R=0)=110°$ K., and
(2) $J_c=13600$ A/cm$^2$ for $r=$infinity to 1.0 cm, and $J_c=7800$ A/cm$^2$ for $r=0.4$ cm, where r is the radius of curvature when the tape is curved into the shape of an arc.

BRIEF DESCRIPTION OF THE DRAWINGS

The present invention can be more fully understood by a reading to the subsequent detailed description of the preferred embodiments with references made to the accompanying figures, wherein:

FIGS. 1A–1D are schematic illustrations, each of which showing one of the steps in the process according to the present invention, wherein

1C shows the rolling of the swaged silver tube into a thin tape.

FIGS. 2A-2B are two photographs, wherein

FIGS. 4A-4B are two graphical representations showing the I-V characteristics of a tape with respect to various radii of curvature with which the tape is curved with;

DETAILED DESCRIPTION OF THE PREFERRED EMBODIMENTS

The Fabrication Process

The composition used for forming the Bi-based superconducting tape by a process according to the present invention has the following form:

$Bi_{1.81}Pb_{0.43}Sr_{1.71}Ca_{2.14}Cu_3O_x$ which can be prepared either by a mixture consisting of $Bi_2O_3$, PbO, $SrO_3$, $CaCO_3$ and CuO or by a solution mixture consisting of $Bi(NO_3)\cdot 5H_2O$, $Pb(NO_3)_2$, $Sr(NO_3)_2$, $Ca(NO_3)_3\cdot 4H_2O$ and $Cu(NO_3)_2\cdot 3H_2O$.

The solution method is utilized for making the composition in the preferred embodiment of the process according to the present invention. The solution method comprises the following steps of:

(1) Preparing a solution of a mixture of $Bi(NO_3)_3\cdot 5H_2O$, $Pb(NO_3)_2$, $Sr(NO_3)_2$, $Ca(NO_3)_3\cdot 4H_2O$ and $Cu(NO_3)_2\cdot 3H_2O$ with an atomic weight proportion of Bi:Pb:Sr:Ca:Cu = 1.81: 0.43:1.71:2.14:3;

(2) Adding an oxalic acid containing an oxalic acid and a copper nitrate in a weight ratio of 5.1:3 to the solution;

(3) Stirring the solution for two hours, and then titrating the solution with a 25% ammonium hydroxide solution to pH=7;

(4) Bathing the solution in a 120° C. oil for gelation;

(5) Placing the gel formed in the Step (4) in a furnace for organic decomposition at 300° C. for three hours; and (6) Calcining the product of the Step (5) at 800° C. for 12 hours.

A powder-in-tube is subsequently employed for fabricating superconducting tapes using the powder produced by the foregoing steps. For a detailed understanding of the powder-in-tube method, reference can be made to a technical paper "High-Jc Silver-sheathed Bi-Based Super-conducting Wires" published on "IEEE TRANSACTIONS ON MAGNETICS", Vol. 27, No. 2, Mar. 1991, p.1231-p.1238.

Figure 1A:
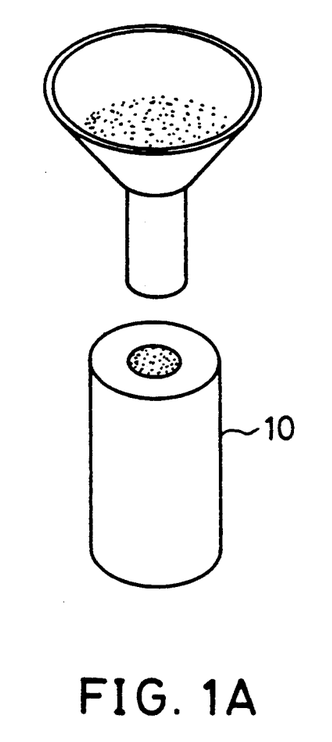
FIG. 1A shows the filling of powder into a silver tube.
Figure 1B:
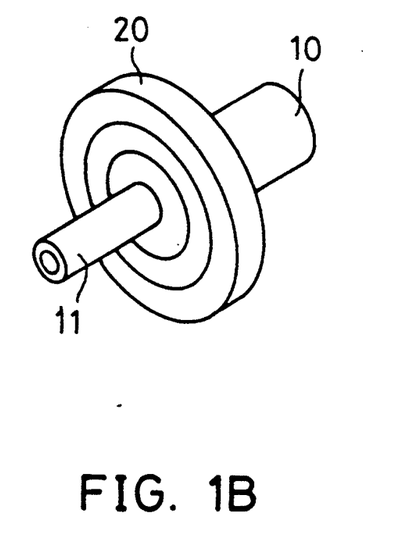
FIG. 1B shows the swaging of the silver tube through a swager, FIG.
Figure 1C:
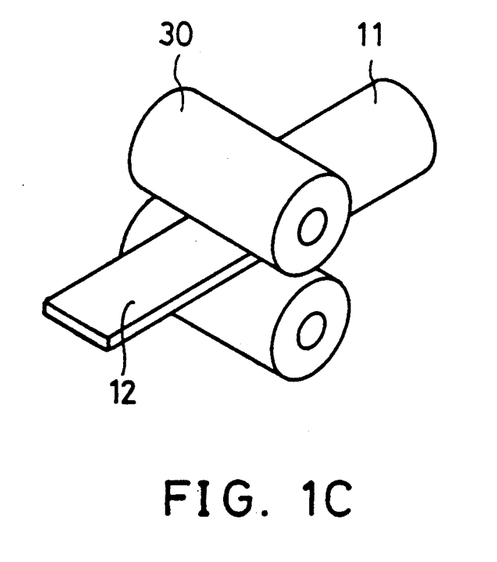
Figure 1D:
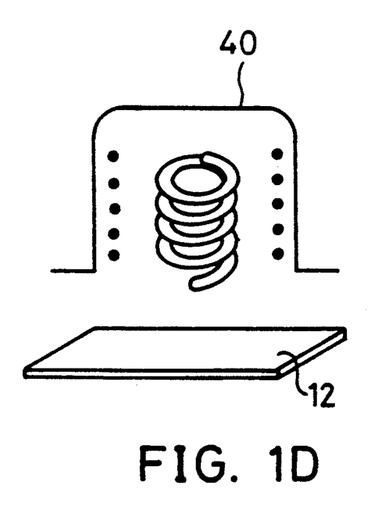
FIG. 1D shows the heat treatment of the thin tape.

The tube utilized by the present invention is made of silver such that the fabricated tape will be silver-sheathed. Referring to the schematic illustrations of FIGS. 1A-1D, the subsequent steps of the process include filling the precursor into a silver tube 10 as shown in FIG. 1A; swaging the silver tube 10 through a swager 20 to reduce the diameter thereof as shown in FIG. 1B; rolling the swaged silver tube 11 into a thin tape 12 as shown in FIG. 1C; and sintering the thin tape 12 in a furnace 40 as shown in FIG. 1D.

The silver tube 10 utilized in the preferred embodiment of the process is a tube with an inner diameter of 4 mm, an outer diameter of 6 mm, and a longitudinal length of 200 mm. In order to facilitate the pressing of the silver tube 10 into thin tape, the silver tube 10 is first swaged to reduce the diameter thereof. This is done by swaging the silver tube 10 through a swager 20 in a reduction rate of 20% per pass and with the silver tube 10 been heated at a temperature of 550° C. between every two swaging passes to reduce the outer diameter thereof to 0.6–0.7 mm.

The swaged silver tube 11 is then cold rolled through a roller 30 to press it into a thin tape 12 with a thickness of 0.3–0.6 mm, and then pressing the thin tape 12 again to reduce the thickness thereof further to 0.1 mm.

Heat treatment is then performed to the thin tape 12 in order to form superconducting phases for the thin tape 12. The heat treatment is a sintering process which comprises the following steps of:

(a) heating the thinner tape in the furnace 40 with the temperature therein gradually rising from room temperature to 843° C. at a rate of 100° C. per hour;

(b) maintaining the temperature in the furnace 40 at 843° C. for 24 hours; and (c) lowering the temperature in the furnace 40 down to the room temperature at a rate of 60° C. per hour;

For producing denser and better oriented grains in the tape, the thin tape 12 after being heat treated with the above sintering process is further pressed to reduce the thickness thereof to 0.060–0.080 mm. Thereafter, the foregoing sintering process is repeated once again to the pressed thin tape 12.

After the second sintering process, the thin tape 12 is further pressed again to reduce the thickness thereof to 0.030–0.070 mm. Another different sintering process is then performed to the further pressed thin tape 12. This sintering process comprises the following steps of:

(a) heating the tape in the furnace 40, the temperature thereof gradually rising from room temperature to 843° C. at a rate of 100° C. per hour;

(b) maintaining the temperature in the furnace 40 at 843° C. for 36–48 hours; and (c) lowering the temperature in the furnace 40 down to the room temperature at a rate of 60° C. per hour.

The thin tape thus fabricated has been sintered after each pressing in the foregoing process for three times to assure the forming of the superconducting phase for the thin tape. Even though it is the characterized feature of the present invention to reduce the thickness of the tape to be equal to or less than 0.07 mm eventually, it is not recommended to press the swaged silver tube 11 to this featured thickness at the first time. Instead, for better result, the thickness of the tape 12 should be reduced gradually and heat treatment should be performed to the tape after each pressing. In this manner, the tape can be fabricated with denser and better oriented grains in the tape as well as with better superconducting phase.

Figure 2A:
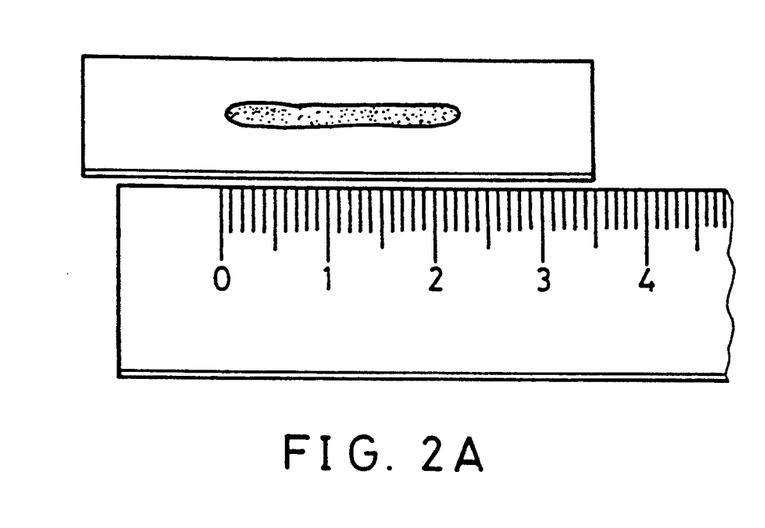
FIG. 2A shows the attachment of the tape to an insulated plate and FIG. 2B shows the bending of the tape into the shape of an arc and the four-point measurement arrangement thereof.
Figure 2B:
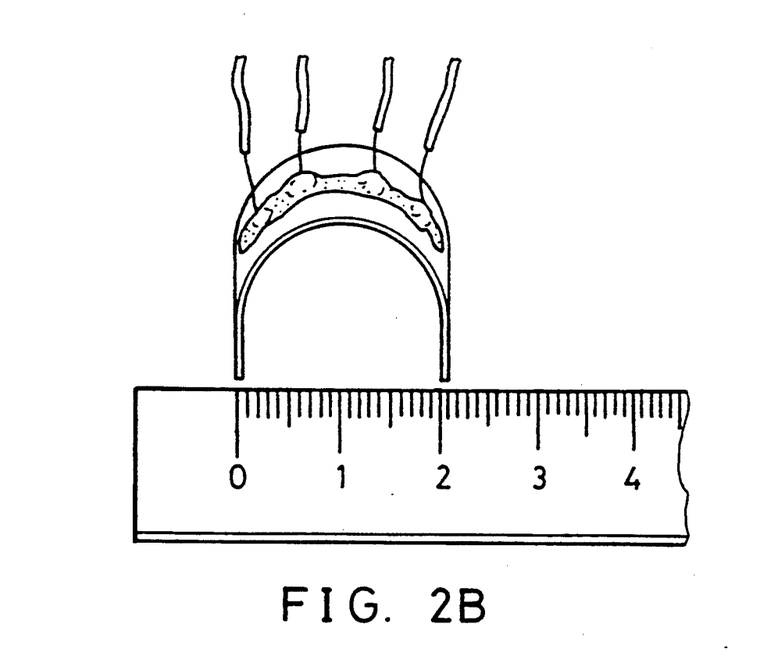

Referring to FIG. 2A-2B, a preliminary experiment is conducted to test the flexibility of the thus fabricated tape and the result is shown therein. The tape was first attached to an insulated plate as shown in FIG. 2A, and then the insulated plate was bent as shown in FIG. 2B. As shown in FIG. 2B, it can be seen from the index of a ruler that the radius of curvature of the bent tape is about 1.05 cm. The test result shows that, at this radius of curvature, the tape is not fractured.

Three experiments will be further conducted to test the superconducting properties of the tape using a four-point measurement arrangement to the tape as shown in FIG. 2B. The first experiment will test the critical temperature of the tape; the second experiment will test the effect of bending the tape to the critical current density $J_c$; and the third experiment will test the effect of the tape thickness to the critical current density $J_c$.

The superconducting tape fabricated by the process according to the present invention is silver-sheathed. Therefore, there is only a fraction of the transverse section of the tape contains the Bi-base superconductive composition. The thickness of this superconductive section will be hereinafter denoted by $t_{sc}$ and the total thickness of the tape will be denoted by $t$.

TEST 1

The Resistivity-Temperature Characteristic

Figure 3:
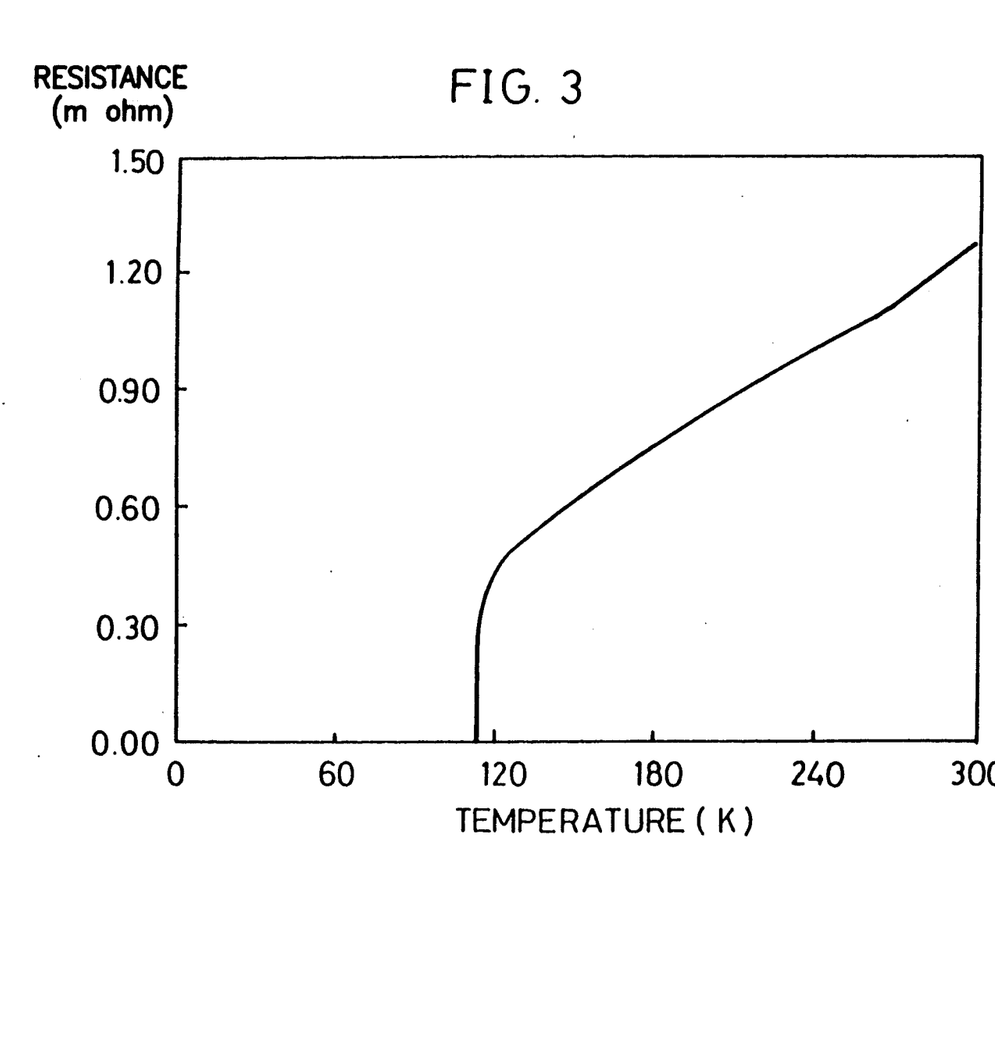
FIG. 3 is a graphical representation, showing the resistivity-temperature characteristic of the super-conducting tape fabricated by the process according to the present invention.

Referring to FIG. 3, a test is conducted to see the resistivity-temperature characteristic of the super-conducting tape fabricated according to the present invention and the result is illustrated therein. It can be seen from the plotted curve that the resistance of the tape drops rapidly to zero when the tape is cooled to a temperature near 110° K. The critical temperature of the superconducting tape is therefore $T_c(R=0)=110°$ K.

TEST 2

Variations of Jc when the Tape is Curved

A tape which has been fabricated with a length of 22 mm, a width of 2.5 mm, and a total thickness of 0.045 mm is employed for this test. The tape is affixed onto a piece of insulated alumina plate as that shown in FIG. 2A and four-point measurement (with a criterion of 1 $\mu$V/cm) arrangement as that shown in FIG. 2B is arranged on the tape for determining the I-V characteristics thereof. In this test, the I-V characteristics of the tape will be measured with the tape being bent into various arcs with different radii of curvature one time after the other. The tape is tested firstly without bending, i.e. when the tape is a straight line segment with the radius of curvature thereof to be $r_1$=infinity. Subsequently, the test is conducted with the same tape being bent into an arc with the radius of curvature thereof to be $r_2=7.20$ cm, $r_3=3.30$ cm, $r_4=2.00$ cm, $r_5=1.50$ cm, $r_6=1.40$ cm, $r_7=1.20$ cm, $r_8=0.90$ cm, $r_9=0.67$ cm, $r_{10}=0.60$ cm, $r_{11}=0.50$ cm, or $r_{12}=0.40$ cm at each time.

Figure 4A:
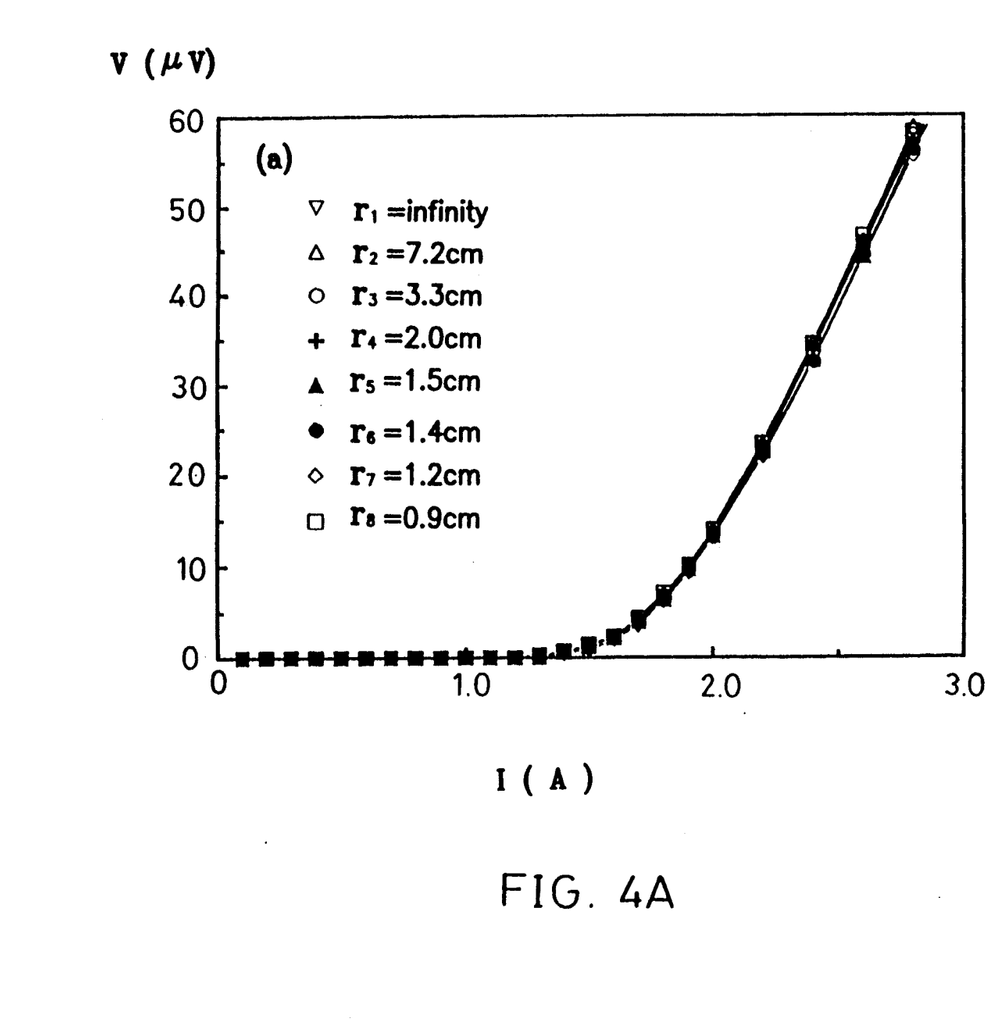
Figure 4B:
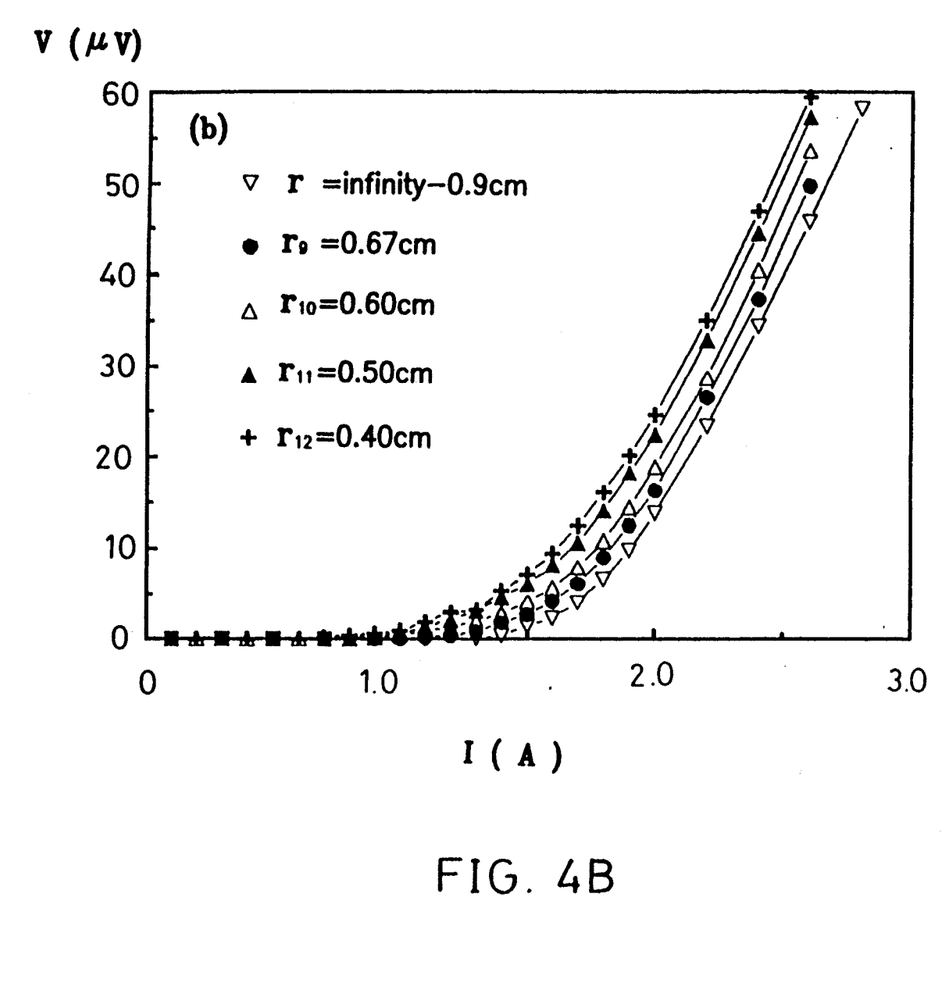

As the tape is bent into an arc with one of the above radii of curvature $r_1$-$r_{12}$, various currents are applied thereto to measure the voltage responses thereof. The test results are graphically illustrated in FIGS. 4A-4B. In each of the figures, the abscissa is the applied current I, the ordinate is the voltage response V, and the curves are given corresponding to the various radii of curvature. The I-V characteristic curves of the tape corresponding to $r_1$ to $r_8$ are shown in FIG. 4A. The I-V characteristic curves of the tape corresponding to $r_9$ to $r_{12}$ are shown in FIG. 4B.

From the above test results, it can be concluded that the critical current density $J_c$ of the tape is nearly a constant of 10200 A/cm$^2$ if the tape is bent into an arc with the radius of curvature thereof in the range from infinity to 0.9 cm. If the tape is further bent to an arc with the radius of curvature thereof to be 0.67 mm, there will be noticeable degeneration in the Jc therein. If r=0.4 cm, Jc is measured to be 7800 A/cm$^2$. Compared with Jc=250 A/cm$^2$ with r=0.5 cm of the Onishi et al patent, the present invention obviously has come out with a much superior superconductor.

In addition, another similar test is conducted except wherein a tape with a different total thickness t=0.07 mm ($t_{sc}$=0.020 mm) is employed. This tape is also bent one time after the other into an arc with a radius of curvature thereof to be $r_0$=infinity, $r_1'=1.80$ cm, $r_2'=1.00$ cm, $r_3'=0.70$ cm, $r_4'=0.55$ cm, or $r_5'=0.42$ cm at each time. The I-V characteristic curves corresponding to these radii of curvature with which the tape is curved with are shown in FIG. 5.

Figure 5:
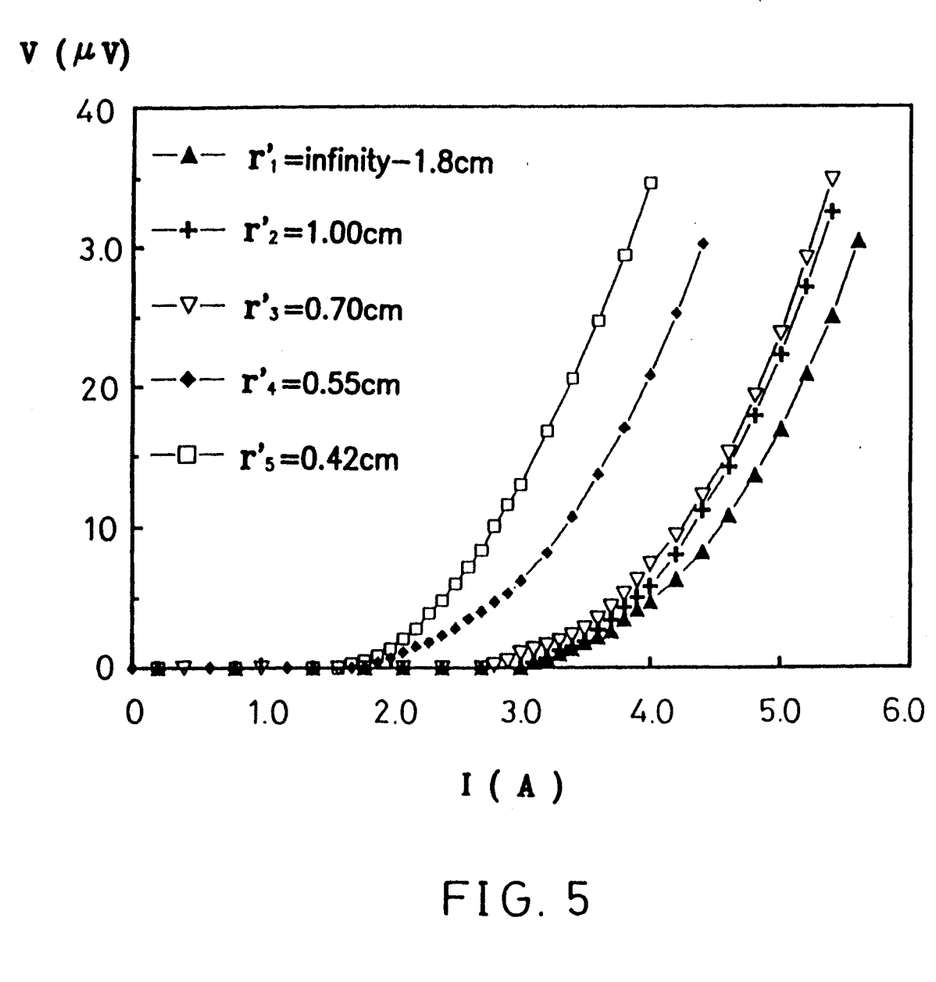
FIG. 5 is a same graphic representation as those shown in FIGS. 4A-4B except that showing the I-V characteristics of a tape with a different thickness.

The I-V characteristic curve corresponding to $r_1'=1.80$ cm is measured to be very close to that corresponding to $r_0$=infinity (a straight line segment) and therefore the two curves corresponding to $r_0$=infinity and $r_1'=1.80$ are drawn in FIG. 5 as a single curve. The test result shows that the critical current density $J_c$ of this tape will not b=significantly degenerated until the tape is curved with the radius of curvature thereof below 1.80 cm. Comparing the curve corresponding to $r_1'=1.80$ cm with the curve corresponding to $r_2'=1.0$ cm, it is found that the critical currents density Jc thereof are the same (Jc=13600 A/cm) but the normal state resistivities deviate at higher currents. This may be caused by some microcracks in the tape which are resulted when bending the tape (at room temperature). This implies that the value of the curvature C of the tape, which is defined as the reciprocal of radius of curvature $C=1/r$, exceeds the value of the total percent elongation TPE, or strain, which is defined as TPE=$(t_{sc}/BD) \times 100\%$ where BD is the diameter of the tape when it is bent into a circular loop with the critical current density $J_c$ thereof not being significantly degenerated.

TEST 3

Variation of Jc with respect to the Thickness of the Tape

It is the most important aspect of the present invention to fabricate the Bi-base superconducting tape to a thickness less than 0.07 mm. This test is, therefore, directed to see the variation of the critical current density Jc with respect to the thickness of the tape.

Four tape samples are prepared for the test and the thicknesses thereof are:

$t_1=0.100$ mm (with $t_{sc}=0.033$ mm),
$t_2=0.090$ mm (with $t_{sc}=0.030$ mm),
$t_3=0.070$ mm (with $t_{sc}=0.020$ mm), and
$t_4=0.045$ mm (with $t_{sc}=0.010$ mm)

respectively. This test will be conducted to measure the Jc/Jc$_0$—C characteristics for the four tape samples (Jc/Jc$_0$ is the ratio of Jc to Jc$_0$, and where Jc$_0$ denotes the value of the critical current density $J_c$ of the tape when the tape is not curved, i.e. when the tape is a straight line segment and C is the curvature and equals to 1/r as mentioned above).

Figure 6:
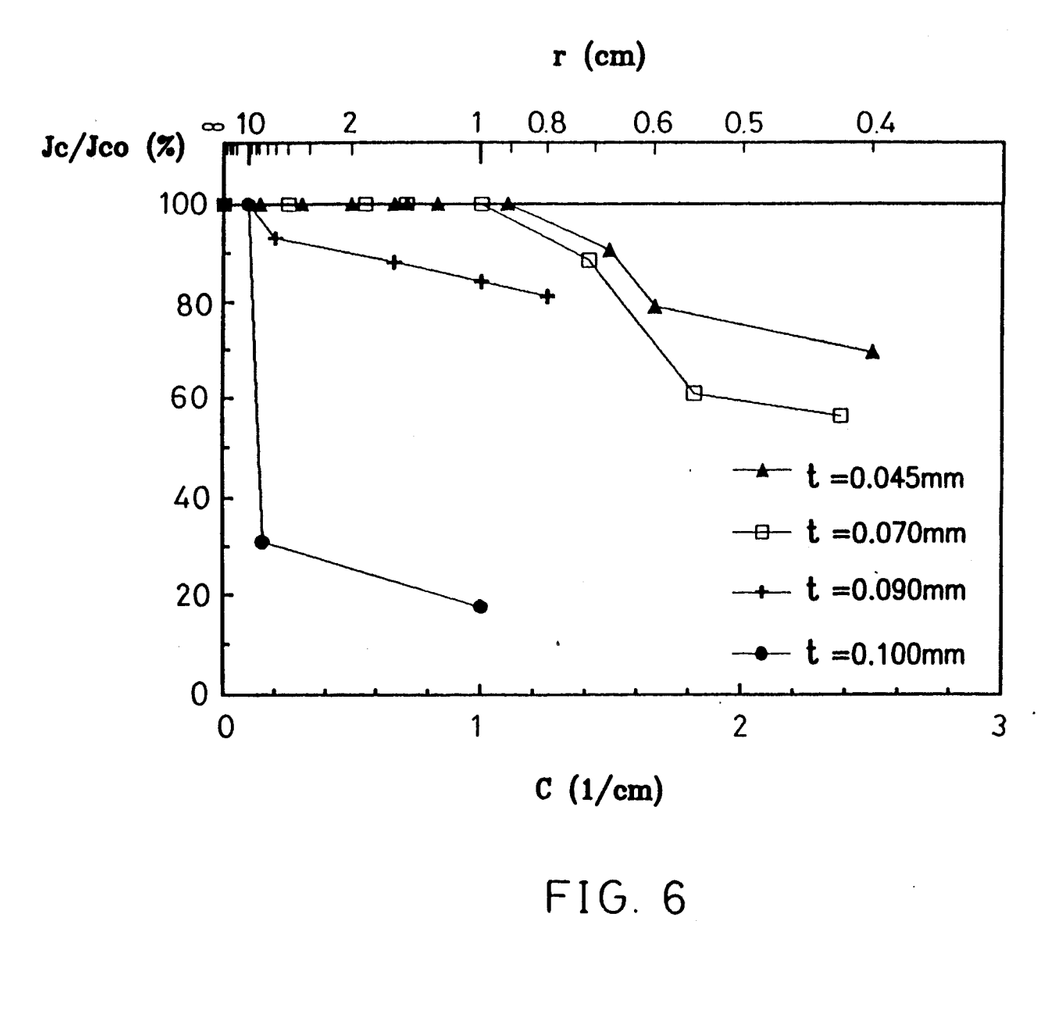
FIG. 6 is a graphical representation, showing the Jc/Jc0—C characteristics of several samples of the super-conducting tape with different thicknesses.

The test result is graphical illustrated in FIG. 6; wherein the abscissa represents the curvature C, the ordinate represents $Jc/Jc_0$ in percentage, and the four curves are given for the four tape samples. It can be seen from the curves that $J_c$ drops rapidly for the tape sample with the thickness of $t_1=0.100$ mm as the curvature C thereof increases. However, for each of the tape samples with the thicknesses of $t_2=0.090$ mm, $t_3=0.070$ mm, or $t_4=0.045$ mm, the corresponding $Jc/Jc_0$—C curve decays slowly as the curvature C thereof increases. The thinner the thickness of the tape sample is, the better the $Jc/Jc_0$—C characteristic curve thereof becomes; i.e. a thinner tape sample is with a higher $J_c$ when the curvature thereof is the same with a thicker tape sample.

Furthermore, from the curves shown, we can deduce that the TPE value of the tape is in a range between 0.05% and 0.1% for $t_{sc} < 0.020$ mm; and is below 0.05% for $t_{sc} > 0.02$ mm. This can be explained by that the density of the thinner tape sample is higher than that of the thicker tape sample. Therefore, the TPE of the tape can be improved by pressing the tape to a thinner thickness.

While the present invention has been described in a preferred process comprising specific steps, it is to be understood that the specific steps can be varied in a number of other ways and such variations will not be regarded as departing from the spirit of the present invention. Therefore, the thus described steps are not intended to limit the scope of the present invention.

What is claimed is:

1. A process for fabricating a superconducting tape, comprising:
   (a) preparing a $Bi_{1.81}Pb_{0.43}Sr_{1.71}Ca_{2.14}Cu_3O_x$ superconducting composition;
   (b) filling a silver tube with the superconducting composition;
   (c) gradually forming, from the filled silver tube, a tape with a thickness equal to or less than 0.07 mm through a series of at least two pressing steps, each pressing step being followed by a heat-treatment process which comprises raising gradually the temperature of the pressed tape from a room temperature of about 25° C. to an elevated temperature of about 843° C., maintaining the tape at the elevated temperature of about 843° C. for a period of about 24 to 48 hours, and decreasing gradually the elevated temperature to the room temperature.

2. The process for fabricating a superconducting tape as set forth in claim 1, wherein said superconducting tape is formed to a thickness of 0.045 mm.

* * * * *